(12) United States Patent
Mohr et al.

(10) Patent No.: US 8,564,269 B2
(45) Date of Patent: Oct. 22, 2013

(54) SYSTEMS AND METHODS FOR SCALING A SIGNAL IN A POWER FACTOR CORRECTION CIRCUIT

(75) Inventors: David Paul Mohr, Spring, TX (US); Zachary J. Garbozy, Spring, TX (US); Mohamed Amin Bemat, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 238 days.

(21) Appl. No.: 13/133,364

(22) PCT Filed: Dec. 13, 2008

(86) PCT No.: PCT/US2008/086737
§ 371 (c)(1),
(2), (4) Date: Jun. 7, 2011

(87) PCT Pub. No.: WO2010/068223
PCT Pub. Date: Jun. 17, 2010

(65) Prior Publication Data
US 2011/0235372 A1    Sep. 29, 2011

(51) Int. Cl.
*G05F 1/00* (2006.01)
*G05F 3/16* (2006.01)

(52) U.S. Cl.
USPC ........... 323/284; 323/222; 323/223; 323/224; 323/282; 323/285

(58) Field of Classification Search
USPC ................ 323/205–208, 222–225, 259, 266, 323/280–286
See application file for complete search history.

(56) References Cited

U.S. PATENT DOCUMENTS

| | | | | |
|---|---|---|---|---|
| 4,437,146 A | * | 3/1984 | Carpenter | 323/222 |
| 4,630,186 A | * | 12/1986 | Kudo | 363/19 |
| 5,349,254 A | | 9/1994 | Sakarya | |
| 5,657,238 A | * | 8/1997 | Lindeboom | 702/65 |
| 5,764,039 A | | 6/1998 | Choi et al. | |
| 5,925,986 A | * | 7/1999 | Moisin | 315/247 |
| 6,034,513 A | * | 3/2000 | Farrington et al. | 323/222 |
| 6,128,205 A | | 10/2000 | Bernd et al. | |
| 6,178,104 B1 | | 1/2001 | Choi | |
| 6,259,614 B1 | | 7/2001 | Ribarich et al. | |
| 6,380,723 B1 | * | 4/2002 | Sauer | 323/315 |
| 6,385,547 B1 | * | 5/2002 | Bogli | 702/64 |
| 6,469,917 B1 | | 10/2002 | Ben-yaakov | |
| 6,737,845 B2 | | 5/2004 | Hwang | |
| 6,768,655 B1 | * | 7/2004 | Yang et al. | 363/21.01 |
| 7,183,753 B2 | | 2/2007 | Tsuruya | |
| 7,202,640 B2 | | 4/2007 | Morita | |

(Continued)

FOREIGN PATENT DOCUMENTS

| | | |
|---|---|---|
| JP | 2005-020811 | 1/2005 |
| JP | 2005-020811 | 1/2008 |

Primary Examiner — Bao Q Vu
Assistant Examiner — Yusef Ahmed

(57) ABSTRACT

Systems and methods for scaling a current signal in a power factor correction circuit are disclosed. An exemplary method may include providing a power factor correction circuit for a power supply, the power factor correction circuit having a first current sensing resistor connected on a return path to a rectified AC line. The method may also include measuring current across the first current sensing resistor. The method may also include switching on at least a second current sensing resistor in parallel with the first current sensing resistor if the measured current increases above a threshold value.

18 Claims, 3 Drawing Sheets

(56) References Cited

U.S. PATENT DOCUMENTS

| 7,375,995 | B1 | 5/2008 | Cheng | |
| 2002/0011867 | A1* | 1/2002 | Nagai et al. | 324/765 |
| 2002/0196644 | A1* | 12/2002 | Hwang | 363/89 |
| 2007/0014134 | A1* | 1/2007 | Shih | 363/52 |
| 2009/0179652 | A1* | 7/2009 | Obara | 324/537 |
| 2009/0251934 | A1* | 10/2009 | Shteynberg et al. | 363/81 |

* cited by examiner

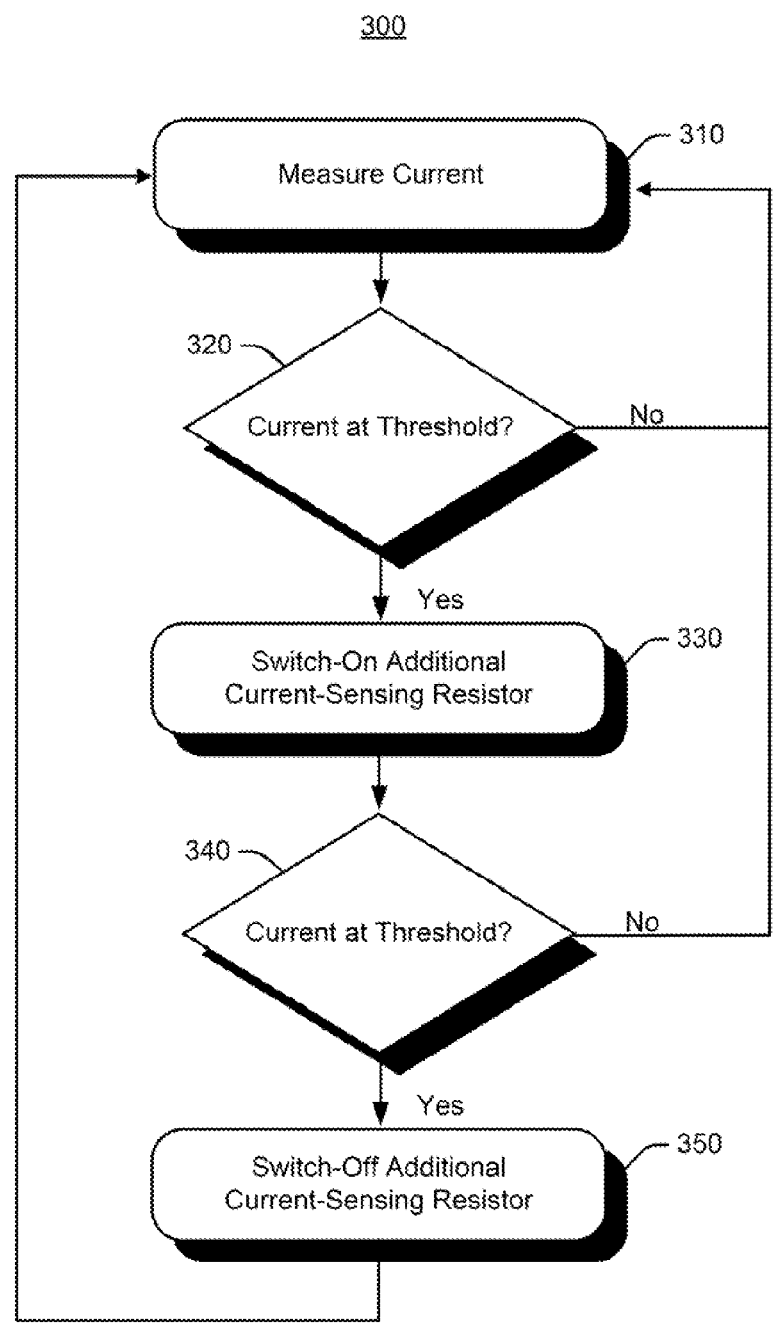

SYSTEMS AND METHODS FOR SCALING A SIGNAL IN A POWER FACTOR CORRECTION CIRCUIT

BACKGROUND

The power factor (PF) of an alternating current (AC) electric circuit is the ratio of real power to apparent power, and is expressed as a number between 0 and 1.0 (or as a percentage). Real power is the capacity of the circuit to perform work in a given time, and apparent power is the product of the current and voltage of the circuit. Various factors (e.g., a non-linear load, or the amount of energy stored in the load versus energy returned to the power source) can cause the apparent power to exceed the real power, increasing power losses through the utility company's electrical transmission and distribution lines. Utility companies may even charge higher rates to customers who do not maintain high power factors.

Accordingly, it is often desirable to adjust the power factor of an electronics system (e.g., a computer server or collection of servers such as a "server farm"). Power factor correction (PFC) circuits are available that bring the power factor of an AC circuit closer to 1.0. Typical PFC circuits operate by determining the PF and adding capacitors and/or inductors to cancel the inductive or capacitive effects of the load. The PF can be determined by dividing the power (in Watts) by the product of measured voltage and current. Therefore, it is important for the voltage and current measurements to be accurate.

Sensing elements for measuring voltage and current in PFC circuits are generally sized to minimize power loss for the highest rated output power at the lowest rated input voltage. But when operating at the lowest rated output power at the highest rated input voltage, the voltage signal generated by the sensing element can be very small, with a poor signal to noise ratio. The decreased accuracy in this measurement makes it more difficult to maintain an optimal PF.

BRIEF DESCRIPTION OF THE DRAWINGS

FIG. 3 is a flowchart illustrating exemplary operations for scaling a signal in a PFC circuit.

DETAILED DESCRIPTION

Systems and methods described herein may be implemented in a power factor correction (PFC) circuit for scaling a signal (e.g., a current signal). The PFC circuit may be provided for a power supply in an electronics systems (e.g., one or more computer server). In an exemplary embodiment, the PFC circuit may include a first current sensing resistor connected on a return path to a rectified AC line for a current measurement. The current sensing resistor has to be sized for a maximum expected load. For example, the resistor may be sized for a 10 Amp load from the AC outlet. However, if the electronics system is drawing less current (e.g., 1 Amp), the current signal is much smaller and less accurate. Accordingly, current across the first current sensing resistor may be measured, and at least a second current sensing resistor may be switched on in parallel with the first current sensing resistor if the measured current increases above a threshold value. Likewise, at least the second current sensing resistor is switched off if the measured current decreases below the threshold value. Of course, multiple resistor/switch elements may be added to scale the signal across any desired range of the PFC circuit.

According to exemplary embodiments described herein, the signal amplitude may be increased without increasing power losses across a full range of operation of the electronics device. The increased signal level results in improved input measurement accuracy, which may be used to increase the power factor (PF) across a full operating range of the PFC circuit.

Exemplary System

Figure 1A:
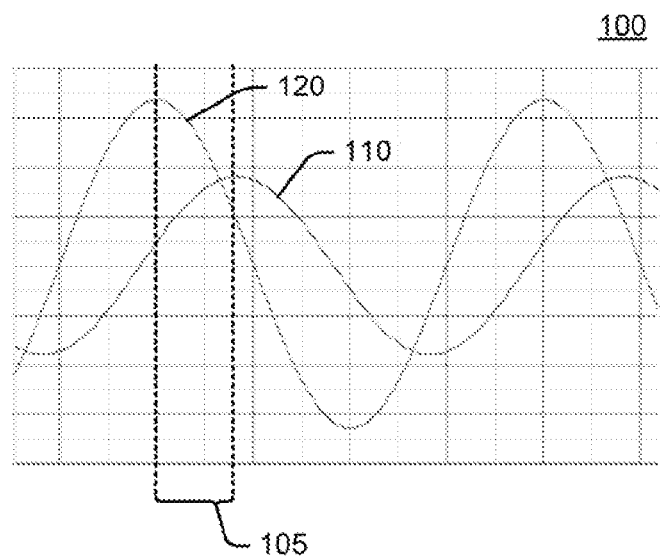
FIG. 1 is a high-level illustration of an exemplary computer system and the resulting PF under load, wherein (a) shows a plot with a lagging power factor (PF<1.0), (b) shows a plot with a PF at or near 1.0.
Figure 1B:
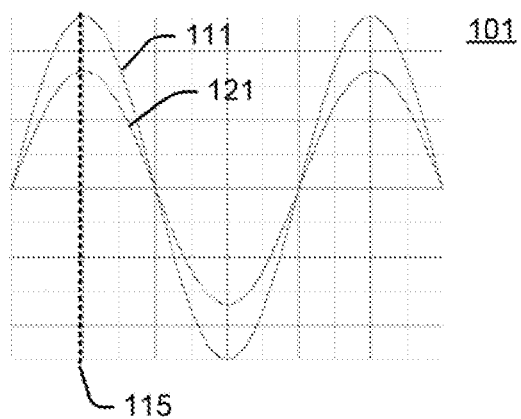

FIG. 1 is a high-level illustration of an exemplary computer system and the resulting PF under load, wherein (a) shows a plot 100 with a lagging power factor (PF<1.0), (b) shows a plot 101 with a PF at or near 1.0. The example shown in FIG. 1a corresponds to an electronics system (e.g., one or more server computers) without any PF correction. It can be seen from the example shown in plot 100 that the current waveform 110 lags the voltage waveform 120 by about 75 degrees (note the lag illustrated by bracket 105). As discussed above, operating under these conditions is undesirable for a number of reasons.

A PFC circuit (e.g., the PFC circuit 200 in FIG. 2) may be implemented in the electronics system, e.g., as part of the power supply electronics. The PFC circuit 200 functions to correct lag between the current signal 110 and the voltage signal 120 in order to approach or meet a PF of 1.0, as illustrated by the plot 101 in FIG. 1b. It is observed in the plot 101 that after correction the lag is much less (indeed, in FIG. 1b there is no lag as illustrated by reference 115) between current signal 111 and voltage signal 121.

The PFC circuit 200 may correct lag by determining the PF and adding capacitors and/or inductors to cancel the inductive or capacitive effects of the load. The PF can be determined based on voltage and/or current measurements. Therefore, it is important for these measurements to be accurate. However, when the electronics system is drawing less current than the sensing element is sized for (e.g., drawing 1 Amp instead of 10 Amps), the signal may be too small for accurate measurements. Accordingly, the signal may need to be amplified or scaled.

Figure 2:
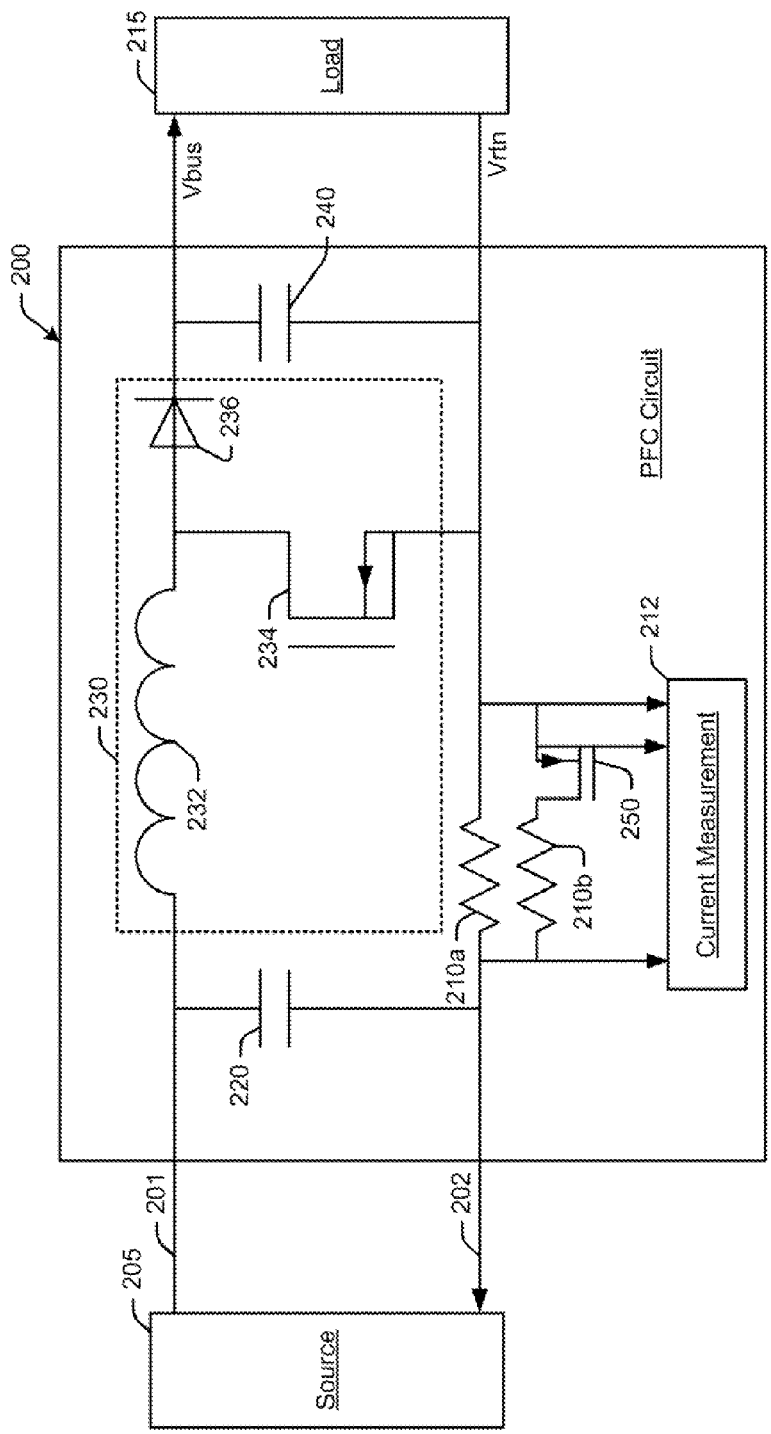
FIG. 2 is a schematic diagram illustrating an exemplary PFC circuit which may be implemented for scaling a signal.

FIG. 2 is a schematic diagram illustrating an exemplary PFC circuit 200 which may be implemented for scaling a signal. The PFC circuit 200 may include a plurality of current sensing resistors 210a, 210b connected on a return path 202 of a rectified AC line. The plurality of current sensing resistors 210a, 210b may be used for the current measurement.

In an exemplary embodiment, the number of current sensing resistors 210a, 210b which are switched in may be varied to scale the current signal based on the operating conditions. For example, the first resistor 210a may be sized for the lowest expected current (e.g., 1 Amp) to provide a larger signal sense. If the electronics system is drawing more current than the first current sensing resistor 210a is sized for, the current signal may not be suitable for accurate measurements. Accordingly, one or more additional current sensing resistors 210b may be switched on in parallel with the first current sensing resistor 210a when the measured current increases above a threshold value, to lower the equivalent resistance while maintaining the signal level. Likewise, the additional current sensing resistors 210b may be switched off if the measured current decreases back below the threshold value.

It is noted that any suitable threshold (or thresholds) may be implemented and may depend on various design considerations. For example, multiple threshold intervals may be implemented to switch on/off current sensing resistors for different intervals. Exemplary design considerations may include, but are not limited to, sizing of the current sensing resistors, the number of current sensing resistors, the desired granularity, the desired ability for scaling, and the desired level of signal magnification.

Exemplary PFC circuit 200 is shown in FIG. 2 as it may be implemented in hard-wired circuitry. However, it is noted that the circuit may also be implemented in other circuitry (e.g., logic gates) as will be readily apparent to those having ordinary skill in the art after becoming familiar with the teachings shown and described herein.

The PFC circuit 200 may be connected on lines 201, 202 between a bridge (not shown) to an AC power source 205 (e.g., an electrical outlet) and a load 215 (e.g., a server computer). The bridge provides a rectified AC signal which behaves as a "partial DC" signal. Bridges for providing a rectified AC signal are well known in the electronics arts, and generally operate by "flipping" the negative portion of the AC sine wave so that it is additive with the positive portion of the AC sin wave. Capacitor 220 serves as a high frequency filter element.

The PFC circuit 200 may include a boost circuit 230 to provide a power supply "boost" to the load 215. An exemplary boost circuit 230 may include an inductor 232 controlled by the field-effect transistor (FET) 234 and diode 236. The boost circuit 230 boosts the voltage supplied on the voltage bus (Vbus) 201. A capacitor 240 may be provided to hold the charge. The return bus (Vrtn) 202 provides a path back to the AC power source 205.

Boost circuits such as the one just described are well-understood in the electronics arts, and the specific components called out above are merely illustrative of one type of boost circuit which may be implemented. Other types of boost circuits may also be used, as will be readily understood by those having ordinary skill in the art after becoming familiar with the teachings herein.

A plurality of current sensing resistors 210a, 210b may be provided on the return line 202. Although only two current sensing resistors 210a, 210b are shown in FIG. 2, it is noted that any number of current sensing resistors may be implemented.

The output from the current sensing resistors 210a, 210b may be used for the boost circuit 230 (e.g., as a current measurement 212) to control output the desired level of PF correction via FET 234. The first resistor 210a is connected in-line on the return bus 202, and may be selected or sized for a minimum expected load (e.g., 1 Amp). The second resistor 210b is switchable in and out of the circuit using a switching element 250.

In operation, when the load increases above a threshold value (e.g., over about 1 Amp), the second resistor 210b combines with the first resistor 210a to provide an overall lower resistance on the return bus 202 for accurate current measurements at higher currents (e.g., by amplifying the signal up to about 10 Amps).

When the load decreases (e.g., below 1 Amp), switching element 250 is activated to switch off or "remove" the second resistor 210b from the return bus 202. At which time, the first resistor 210a provides an overall higher resistance on the return bus 202 for accurate measurements at lower current.

In exemplary embodiments, the current-sensing switch may be selected based on threshold values for magnifying the amplitude of the current signal for accurate current measurements. Although any suitable switching element may be implemented, in an exemplary embodiment the switching element 250 may be a current-sensing switch which automatically turns on/off at a predetermined current level, hence connecting/disconnecting the second resistor 210b in-line on the return bus 202.

It is noted that multiple switching elements (or a single switching element operable to switch in multiple resistors) may also be implemented where more current intervals are desired, or for failover purposes.

Before continuing, it is noted that the PFC circuit 200 may be configured at run-time so that the current sensing path is configured based on operational data for the circuit. Also in exemplary embodiments, configuration of the current sensing path may be maintained during operation. Accordingly, the current sensing path is adaptable and may be reconfigured, e.g., based on changes in the run-time environment.

It is also noted that the systems and methods described herein do not need to be implemented in any particular circuit design. The circuit design described with reference to FIG. 2 is provided merely as exemplary of one embodiment of a circuit. It is contemplated that those having ordinary skill in the art, after becoming familiar with the teachings herein, will be able to provide other circuit designs for scaling a current signal in a power factor correction circuit.

Exemplary Operations

FIG. 3 is a flowchart illustrating exemplary operations 300 for scaling a signal in a power factor correction circuit. In an exemplary embodiment, the components and connections depicted in the figures may be used. It is also contemplated that in other embodiments, operations shown and described herein may be implemented in other circuitry, logic components, and/or control logic such as a processor or processing units.

In operation 310, current may be measured across a first current sensing resistor. In operation 320, a determination is made whether the current measured in operation 310 drops below a threshold value. If the measured current increases above the threshold value, at least a second current sensing resistor may be switched on in parallel with the first current sensing resistor in operation 330. The determination 320 may also be repeated until the measured current increases above the threshold value.

It is noted that additional current sensing resistors may also be switched on, e.g., depending on the desired accuracy of the current measurement. In an exemplary embodiment, determination 320 may be repeated in a step-wise manner in order to discern how many current sensing resistors should be switched on.

In operation 340, another determination is made whether the current measured in operation 310 decreases below a threshold value. In operation 350, the additional current sensing resistor(s) may be switched off if the measured current decreases below the threshold value. Again, the determination multiple current sensing resistors may be switched off based on a comparison to multiple threshold values.

The operations shown and described herein are provided to illustrate exemplary implementations for scaling a current signal in a power factor correction circuit. Still other operations may also be implemented.

In addition to the specific embodiments explicitly set forth herein, other aspects will be apparent to those skilled in the art from consideration of the specification disclosed herein. It is intended that the specification and illustrated embodiments be considered as examples only, with a true scope and spirit of the following claims.

The invention claimed is:

1. A method for scaling a signal in a power factor correction (PFC) circuit, comprising:

providing the PFC circuit for a power supply, the PFC circuit having a first current sensing resistor connected on a return path to a rectified AC line;

measuring current across the first current sensing resistor; and switching off at least a second current sensing resistor in parallel with the first current sensing resistor if the measured current drops below a threshold value.

2. The method of claim 1 further comprising switching on the second current sensing resistor if the measured current increases above the threshold value.

3. The method of claim 1 wherein the second current sensing resistor has a lower resistance rating than the first current sensing resistor.

4. The method of claim 1 wherein the second current sensing resistor in parallel with the first current sensing resistor has a lower resistance rating than the first current sensing resistor alone.

5. The method of claim 1 wherein the second current sensing resistor switched on in parallel with the first current sensing resistor increases measurement sensitivity of a current signal on the return path.

6. The method of claim 1 further comprising increasing signal amplitude to enhance current measurement accuracy for a low amplitude current signal on the return line.

7. The method of claim 1 further comprising switching on at least a third current sensing resistor in parallel with the first and second current sensing resistors to scale a current signal on the return line across a range of current signals.

8. A system for scaling a current signal in a power factor correction (PFC) circuit, comprising:

a first current sensing resistor connected on a return path in the PFC circuit;

at least a second current sensing resistor; and a switch operable to connect at least the second current sensing resistor in parallel with the first current sensing resistor if the measured current increases above a threshold value.

9. The system of claim 8, wherein the switch is operable to switch on the second current sensing resistor if the measured current increases above the threshold value.

10. The system of claim 8, wherein the second current sensing resistor has a resistance rating lower than or equal to a resistance rating of the first current sensing resistor.

11. The system of claim 8, wherein the second current sensing resistor has a lower resistance rating than the first current sensing resistor alone.

12. The system of claim 8, wherein the second current sensing resistor decreases power loss of a current signal on the return path.

13. The system of claim 8, wherein the second current sensing resistor decreases power loss.

14. The system of claim 13, wherein the second current sensing resistor increases current measurement accuracy for a high current signal on the return line.

15. The system of claim 13, wherein power loss is unaffected or decreases across a full range of operation for equivalent measurement accuracy.

16. The system of claim 8, further comprising at least one more than at least the second current sensing resistor switchable in parallel with the first current sensing resistor to further scale a current signal on the return line across a range of current signals.

17. A system for sealing a current signal in a power factor correction circuit, comprising:

first current sensing means connected on a return path;

at least second current sensing means provided in parallel with the first current sensing means; and means for switching on at least the second current sensing means if current measured across the first current sensing means increases above a threshold value.

18. The system of claim 17 further comprising means for switching off the at least second current sensing means if the measured current decreases below the threshold value.

* * * * *

UNITED STATES PATENT AND TRADEMARK OFFICE
CERTIFICATE OF CORRECTION

PATENT NO. : 8,564,269 B2
APPLICATION NO. : 13/133364
DATED : October 22, 2013
INVENTOR(S) : David Paul Mohr et al.

Page 1 of 1

It is certified that error appears in the above-identified patent and that said Letters Patent is hereby corrected as shown below:

In the Claims

In column 6, line 26, in Claim 17, delete "sealing" and insert -- scaling --, therefor.

Signed and Sealed this
Fourth Day of February, 2014

Michelle K. Lee
*Deputy Director of the United States Patent and Trademark Office*